United States Patent [19]

Ohsawa

[11] Patent Number: 5,166,558
[45] Date of Patent: Nov. 24, 1992

[54] CMOS ECL/TTL OUTPUT CIRCUIT

[75] Inventor: Takashi Ohsawa, Yokohama, Japan

[73] Assignee: Kabushiki Kaisha Toshiba, Kanagawa, Japan

[21] Appl. No.: 675,952

[22] Filed: Mar. 27, 1991

[30] Foreign Application Priority Data

Mar. 30, 1990 [JP] Japan .................................. 2-81342

[51] Int. Cl.$^5$ .......................................... H03R 19/094
[52] U.S. Cl. .................................. 307/475; 307/443; 307/451; 307/360
[58] Field of Search ............... 307/443, 446, 448, 450, 307/451, 452, 453, 475, 270, 264, 570, 585, 477, 542, 544, 360

[56] References Cited

U.S. PATENT DOCUMENTS

| | | | |
|---|---|---|---|
| 4,284,910 | 8/1981 | Hofmann et al. | 307/475 |
| 4,691,127 | 9/1987 | Huizer | 307/475 |
| 4,873,673 | 10/1989 | Hori et al. | 307/270 X |
| 4,947,061 | 8/1990 | Metz et al. | 307/475 |
| 4,992,677 | 2/1991 | Ishibashi et al. | 307/443 |
| 5,003,205 | 3/1991 | Kohda et al. | 307/475 |
| 5,038,058 | 8/1991 | Wang | 307/475 |
| 5,043,604 | 8/1991 | Komaki | 307/475 |
| 5,047,657 | 9/1991 | Seevinck et al. | 307/475 X |
| 5,047,663 | 9/1991 | Lee et al. | 307/475 X |

FOREIGN PATENT DOCUMENTS 60-165117  1/1986  Japan .

OTHER PUBLICATIONS

Stefan R. Meier et al., "A 2-μ CMOS Digital Adaptive Equalizer Chip for QAM Digital Radio Modems", IEEE Journal of Solid-State Circuits, vol. 23, No. 5, pp. 1212-1217 (Oct. 1988).

Mark Pedersen, Peter Metz, "Session 15: High-Speed Digital Circuits, FAM 15.3; A CMOS to 100K ECL Interface Circuit", 1989 IEEE International Solid-State Conference, pp. 226-227.

M. Steyaert et al., "A Full 1.2 μm CMOS ECL-CMOS-ECL Converter With Subnanosecond Settling Times", IEEE 1990 Custom Integrated Circuits Conference, pp. 11.4.1-11.4.4.

Michel S. J. Steyaert et al., "ECL-CMOS and CMOS-ECL Interface in Data 1.2-μm CMOS for 150 MHz Digital ECL Data Transmission Systems", IEEE Journal of Solid-State Circuits, vol. 26, No. 1 (Jan. 1991).

*Primary Examiner*—David Hudspeth
*Attorney, Agent, or Firm*—Banner, Birch, McKie & Beckett

[57] ABSTRACT

According to this invention, there is disclosed an output circuit including a MOS transistor having two current paths inserted between a power source voltage and an output terminal, a MOS transistor having two current paths inserted between a power source voltage and the output terminal, a differential amplifier for comparing a reference voltage with an voltage at the output terminal, a differential amplifier for comparing a reference voltage lower than the reference voltage with the voltage at the output terminal, an input terminal for applying an input voltage, a logic gate for receiving an output from the differential amplifier and the input voltage, the logic gate having an output terminal connected to a gate of the MOS transistor, and a logic gate for receiving an output from the differential amplifier and the input voltage, the logic gate having an output terminal connected to a gate of the MOS transistor.

27 Claims, 4 Drawing Sheets

F I G. 1

F I G. 2

F I G. 3

F I G. 4

F I G. 5

F I G. 6

F I G. 7

CMOS ECL/TTL OUTPUT CIRCUIT

BACKGROUND OF THE INVENTION

1. Field of the Invention

The present invention relates to a data output circuit in a CMOS-LSI (complementary MOS type large-scale integrated circuit) and, more particularly, to output circuits used in LSIs required for exchanging a signal between the LSIs at a high speed.

2. Description of the Related Art

In a conventional method, since an output from an LSI formed by a CMOS process is driven by a CMOS driver, it has an amplitude between a ground voltage $V_{SS}$ of 0 V and a power source voltage $V_{cc}$ of several volts. An LSI having a bipolar transistor outputs a TTL-level signal when the internal circuit of the LSI consists of a TTL (transistor-transistor logic) gate, and the LSI outputs an ECL-level signal when the internal circuit of the LSI consists of an ECL (emitter-coupled logic) gate. In recent years, in order to drive a CMOS device at a high speed, a circuit for obtaining an ECL-level output signal from the CMOS device is arranged. The circuit is described in, e.g., "CMOS subnanosecond true-ECL level output buffer", E. Seereinck, J. Dikken, and H. J. Schnmacher, VLSI SYMPOSIUM, 1989, p. 13. "A CMOS to 100 K ECL Interface Circuit", P. Metz, ISSCC, 1989, p. 226. and "A 2-μm CMOS Digital Adaptive Equalizer Chip for QAM Digital Radio Mode", S. R. Meier et al, IEEE Journal of Solid-State Circuits, Vol. 23, No. 5, 1988.

A CMOS device will be continuously used as a major LSI due to its low power consumption. However, since a CMOS-level output (amplitude between $V_{SS}$ and $V_{cc}$) has a large amplitude, when a CMOS device is switched at a high speed, it generates large noise due to an influence of an inductance component on its mounting board. In the future, therefore, a CMOS device will not be suitable for designing a high-speed system.

On the other hand, since TTL- and ECL-level outputs have small amplitudes, even when a device is switched at a high speed, noise is rarely generated to make it easy to design a high-speed system. In practice, a device such as a cache memory requiring a high-speed operation has an ECL-level interface. However, since an ECL gate consisting of a bipolar transistor has high current consumption, a special-purpose package having a fin for suppressing an increase in temperature of a heat sink is disadvantageously required. In addition, although a TTL gate has current consumption lower than that of the ECL gate, it consumes a current larger than that of a CMOS device.

Although various methods of outputting an ECL-level signal from a CMOS circuit have been proposed, none of the methods satisfies requirements for operation speeds and current consumption.

SUMMARY OF THE INVENTION

The present invention has been made in consideration of the above situation, and has as its object to provide an output circuit capable of obtaining a TTL- or ECL-level output having a small amplitude regardless of its CMOS arrangement.

According to the present invention, there is provided an output circuit comprising a first MOS transistor inserted between a power source voltage on a high-potential side and an output terminal, a second MOS transistor inserted between a power source voltage on a low-potential side and the output terminal, a first differential amplifier for comparing a first reference voltage on the high-potential side with a voltage of the output terminal, a second differential amplifier for comparing a second reference voltage on the low-potential side with a voltage of the output terminal, a first logic gate for receiving output and input voltages from the first differential amplifier and for controlling an ON/OFF operation of the first MOS transistor by the output voltage, and a second logic gate for receiving output and input voltages of the second differential amplifier and for controlling an ON/OFF operation of the second MOS transistor by the output voltage.

In an output circuit with the above arrangement, a high-logic TTL-level signal and a low-logic ECL-level are applied as the first reference voltage on the high-potential side and the second reference voltage on the low-potential side, respectively, and a MOS-level input signal is changed into a signal having a TTL- or ECL-level amplitude.

According to the present invention, there is provided an output circuit comprising a MOS transistor inserted between a power source voltage on a high-potential side and an output terminal, a differential amplifier for comparing a reference voltage with a voltage of the output terminal, a logic gate for receiving output and input voltages of the differential amplifier and controlling an ON/OFF operation of the MOS transistor by the output voltage.

In an output circuit with the above arrangement, a high-logic TTL- or ECL-level voltage is applied as a reference voltage, and a high-logic MOS-level input signal is changed to a high-logic TTL- or ECL-level signal.

According to the present invention, there is provided an output circuit comprising a first MOS transistor inserted between a power source voltage on a high-potential side and an output terminal, a differential amplifier for comparing a reference voltage with a voltage of the output terminal, a logic gate for receiving output and input voltages of the differential amplifier and controlling an ON/OFF operation of the first MOS transistor by the output voltage, a second MOS transistor inserted between a power source voltage on a low-potential side and the output terminal and having a gate for receiving the input voltage directly or through an inverter.

In the output circuit with the above arrangement, a high-logic TTL- or ECL-level voltage is applied as the reference voltage, and a high-logic MOS-level input signal is changed to a high-logic TTL- or ECL-level signal.

As described above, according to the present invention, a change in level from a CMOS level to a small-amplitude level is obtained using an output circuit of a CMOS-LSI without using a bipolar process, thereby obtaining a TTL- or ECL level output having a small amplitude. This can contribute to a decrease in output noise of a high-speed switching CMOS-LSI. In addition, a high-speed switching circuit having power consumption lower than that of an output circuit using a bipolar transistor can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Figure 1:
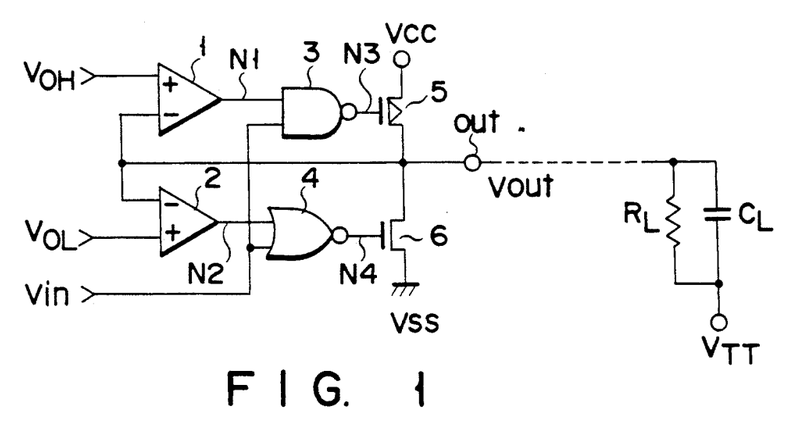
FIG. 1 is a circuit diagram showing an arrangement of an output circuit according to the first embodiment of the present invention.

FIG. 1 is a circuit diagram showing an arrangement of an output circuit according to the first embodiment of the present invention. The circuit is incorporated in a CMOS-LSI and changes a MOS-level signal into a TTL- or ECL-level signal so as to output the signal.

A voltage $V_{OH}$ (e.g., 2.4 V in a TTL level, and 4.2 V in an ECL level) corresponding to a high-logic TTL- or ECL-level is applied as a first reference voltage to a non-inverting input terminal (positive terminal) of a differential amplifier 1 consisting of MOS transistors, and a voltage $V_{out}$ of an output terminal Out is applied to the inverting input terminal (negative terminal) of the differential amplifier 1. Similarly, a voltage $V_{OL}$ (e.g., 0.4 V in a TTL level, 3.3 V in an ECL level) corresponding to a low-logic TTL- or ECL-level is applied as a second reference voltage to the non-inverting input terminal (positive terminal) of a differential amplifier 2 consisting of MOS transistors, and the output voltage $V_{out}$ is applied as a second reference voltage to the inverting input terminal (negative terminal) of the differential amplifier 2. An output signal N1 from the differential amplifier 1 and a CMOS-level input signal $V_{in}$ (having an amplitude between $V_{SS}$ and $V_{cc}$) are applied to a NAND gate 3 consisting of MOS transistors, and an output signal N2 from the differential amplifier 2 and the input signal $V_{in}$ are applied to a NOR gate 4 consisting of MOS transistors.

A p-channel MOS transistor 5 is inserted between a power source voltage $V_{cc}$ on a high-potential side and the output terminal Out, and an n-channel MOS transistor 6 is inserted between the power source voltage $V_{SS}$ on a low-potential side and the output terminal Out. An output signal N3 from the NAND gate 3 and an output signal N4 from the NOR gate 4 are supplied to the gate of the transistor 5 and the gate of the transistor 6, respectively.

An external circuit consisting of a high-resistance element $R_L$ and a capacitor element $C_L$ is connected to the output terminal Out.

An operation of the circuit with the above arrangement will be described below.

When the MOS-level input signal $V_{in}$ is set at a $V_{SS}$ level, since the output signal N3 from the NAND gate 3 goes to "H" level, i.e., $V_{cc}$ level, the p-channel MOS transistor 5 is set in a cutoff state. In this state, assuming that the voltage $V_{out}$ is higher than the $V_{OL}$ level, the output signal N2 from the differential amplifier 2 goes to the $V_{SS}$ level, and the output signal N4 from the NOR gate 4 goes to the $V_{cc}$ level. Therefore, in this case, the n-channel MOS transistor 6 is turned on, and the output voltage $V_{out}$ drops to a lower level. When the $V_{out}$ level is lower than the $V_{OL}$ level, the output signal N2 of the differential amplifier 2 goes to the $V_{cc}$ level, and the output signal N4 from the NOR gate 4 goes to the $V_{SS}$ level. Therefore, the n-channel MOS transistor 6 is set in a cutoff state, and the level drop of the voltage $V_{out}$ is stopped. When the input signal $V_{in}$ is set at a $V_{SS}$ level, the level of the voltage $V_{out}$ is set at the voltage $V_{OL}$ corresponding to a low-logic TTL- or ECL-level.

When the voltage $V_{in}$ is set at the $V_{SS}$ level, assuming that the voltage $V_{out}$ has a level lower than the $V_{OL}$ level, the two transistors 5 and 6 for driving the output terminal Out are set in a cutoff state, and an output from the output terminal goes to a high-impedance state. However, since the output terminal Out is generally connected to a voltage $V_{TT}$ between the voltages $V_{OL}$ and $V_{OH}$ through a high-resistance element $R_L$, the output from the terminal Out is raised to a level higher than that of the voltage $V_{OL}$ after all. As a result, the output is returned to the $V_{OL}$ level by the operation of the n-channel MOS transistor 6. That is, the voltage $V_{out}$ finally corresponds to the $V_{OL}$ level as long as the voltage $V_{in}$ is set in the $V_{SS}$ level.

In contrast to this, when the input signal $V_{in}$ is set at the $V_{cc}$ level, since the output signal N4 from the NOR gate 4 goes to "L" level, i.e., $V_{SS}$ level, the n-channel MOS transistor 6 is set in a cutoff state. In this state, assuming that the voltage $V_{out}$ is lower than the $V_{OH}$ level, the output signal N1 from the differential amplifier 1 goes to the $V_{cc}$ level, and the output signal N3 from the NAND gate 3 goes to the $V_{SS}$ level. In this case, therefore, the p-channel MOS transistor 5 is turned on, and the output voltage $V_{out}$ is raised to have a higher level. When the level of the $V_{out}$ is higher than the $V_{OH}$ level, the output signal N1 from the differential amplifier 1 goes to the $V_{SS}$ level, and the output signal N3 from the NAND gate 3 goes to the $V_{cc}$ level. Thus, when the input signal $V_{in}$ is set at the $V_{cc}$ level, the level of the voltage $V_{out}$ is set at the voltage $V_{OH}$ corresponding to a high-logic TTL or ECL level.

As the input signal $V_{in}$ is changed between the voltage $V_{SS}$ and the voltage $V_{cc}$, the output voltage $V_{out}$ is changed between the voltage $V_{OL}$ and the voltage $V_{OH}$. Therefore, a signal at a CMOS level is converted to a TTL- or ECL-level signal having a smaller amplitude, and the converted signal is output.

Figure 2:
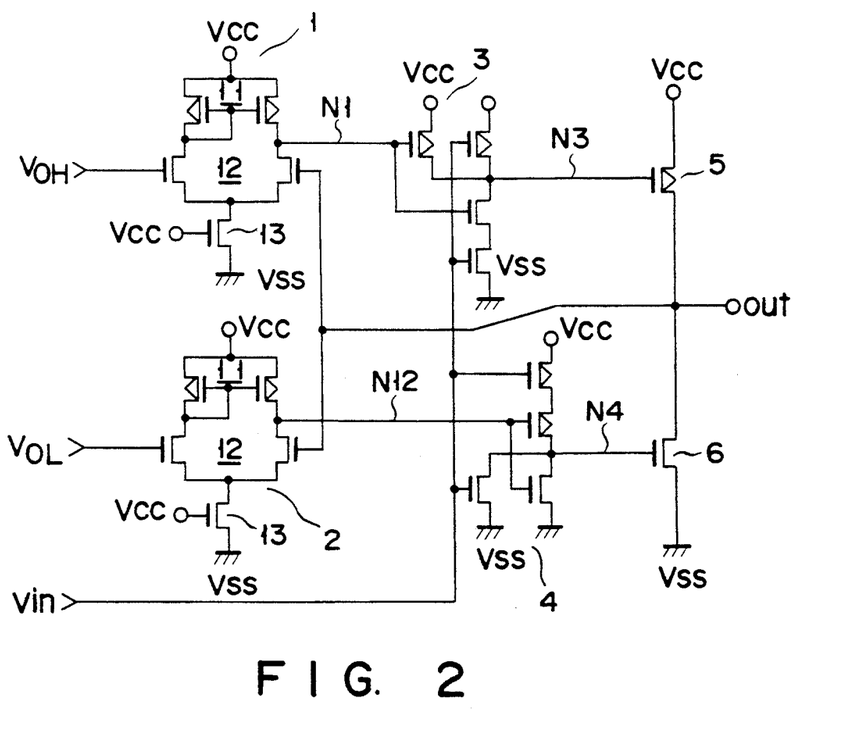
FIG. 2 is a circuit diagram showing a detailed arrangement of the output circuit in FIG. 1 according to the first embodiment.

FIG. 2 shows a detailed arrangement of the circuit according to the above embodiment. Each of the differential amplifiers 1 and 2 is a CMOS current mirror circuit consisting of a current mirror load circuit 11 including two p-channel MOS transistors, a differential pair 12 having two n-channel MOS transistors, a current source n-channel MOS transistor 13 having a gate for receiving the power source voltage $V_{cc}$. The NAND gate 3 and the NOR gate 4 have conventional CMOS circuit arrangements.

Figure 3:
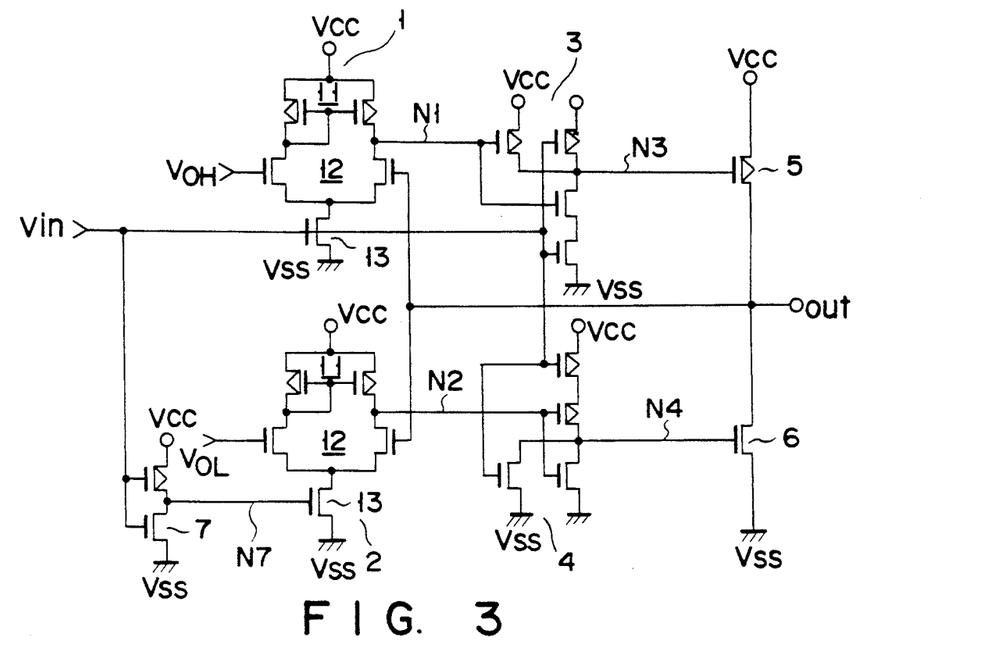
FIG. 3 is a circuit diagram showing an arrangement of an output circuit according to the second embodiment of the present invention.

FIG. 3 is a circuit diagram showing a detailed arrangement of an output circuit according to the second embodiment of the present invention. Note that the same reference numerals as in FIG. 2 denote the same parts in FIG. 3, and a detailed description thereof will be omitted.

In an output circuit according to this embodiment, the power source voltage $V_{cc}$ is not supplied to the gates of the current source n-channel MOS transistors 13 in the two differential amplifiers 1 and 2. In place of this, the input signal $V_{in}$ is directly supplied to the gate of the MOS transistor 13 through the CMOS inverter 7, thereby using the MOS transistors 13 as through current protection switches.

As shown in FIG. 2, when the power source voltage $V_{cc}$ is applied to each of the gates of the MOS transistors 13, predetermined currents are consumed in the two differential amplifiers 1 and 2 regardless of the level of the input signal $V_{in}$. Contrast to this, in this embodiment, any one of the two differential amplifiers 1 and 2 which need not be simultaneously operated is set in a non-operating state so as to reduce the current consumption.

That is, when the signal $V_{in}$ is set at the $V_{cc}$ level, the MOS transistor 13 in the differential amplifier 1 is turned on, and the MOS transistor 13 in the differential amplifier 2 is turned off. In this case, the differential amplifier 1 is set in an operating state, and the differential amplifier 2 is set in a non-operating state, thereby supplying no current to the differential amplifier 2.

Contrast to this, when the signal $V_{in}$ is set at the $V_{SS}$ level, the MOS transistor 13 in the differential amplifier 1 is turned off, and the MOS transistor 13 in the differential amplifier 2 is turned on. In this case, the differential amplifier 1 is set in an nonoperating state, and the differential amplifier 2 is set in an operating state, thereby supplying no current to the differential amplifier 1. As a result, in this circuit, current consumption can be reduced to be half that in the circuit shown in FIG. 2.

Figure 4:
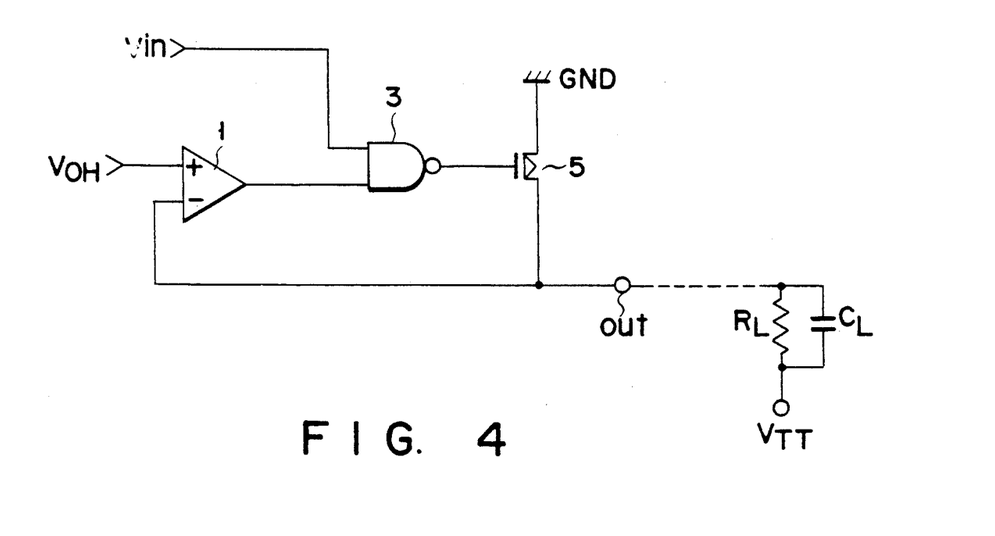
FIG. 4 is a circuit diagram showing an arrangement of an output circuit according to the third embodiment of the present invention.

FIG. 4 is a circuit diagram showing an arrangement of an output circuit according to the third embodiment of the present invention. This circuit is suitable especially for a case wherein a CMOS level is changed to an ECL level, and it is a circuit corresponding to an open-emitter ECL output capable of obtaining a wired OR output. In this case, a power source voltage on a high-potential side is set in a ground voltage of 0 V, and a power source voltage on a low-potential side is set at a negative polarity voltage of, e.g., about −5.2 V. A voltage $V_{OH}$ corresponding to a high-logic ECL-level is set as an voltage of −0.8 V, and a voltage $V_{OL}$ corresponding to a low-logic level is set as a voltage of −1.7 V. Output terminals Out of a plurality of output circuits are connected to each other by a common wire, and the common wire is connected to a voltage $V_{TT}$ of about −2 V through the high-resistance element $R_L$. In this embodiment, a driver for dropping the output terminals Out to an "L" level side need not be arranged. In the circuit according to this embodiment, the differential amplifier on the $V_{OL}$ side of the two differential amplifiers in the circuit shown in FIG. 1 is omitted. In the detailed arrangement of this embodiment, the circuit on the $V_{OL}$ side of the circuit shown in FIGS. 2 and 3 is omitted.

Figure 5:
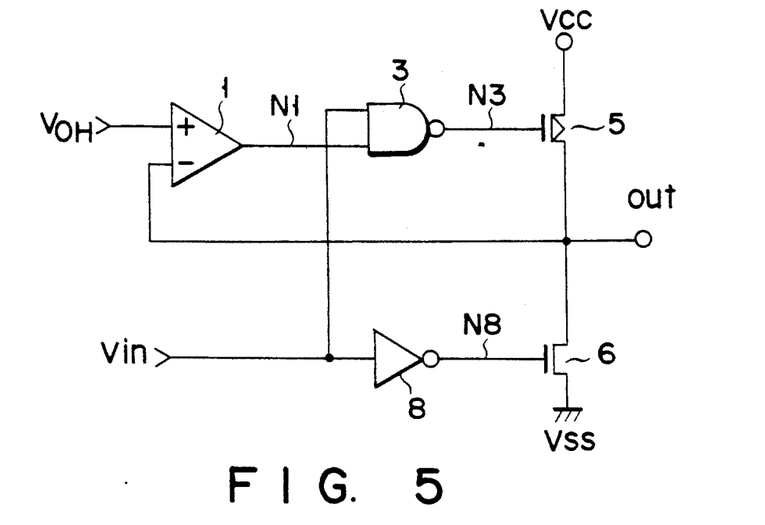
FIG. 5 is a circuit diagram showing an arrangement of an output circuit according to the fourth embodiment of the present invention.

FIG. 5 is a circuit diagram showing an arrangement of an output circuit according to the fourth embodiment of the present invention. In the circuit of this embodiment, "H" level of an output voltage $V_{out}$ is set to be equal to a voltage $V_{OH}$ corresponding to a highlogic TTL- or ECL-level, and the "L" level of the output voltage $V_{out}$ is common to the "L" level of a CMOS level, i.e., $V_{SS}$ level.

In this embodiment, in place of the differential amplifier 2 and the NOR gate 4, an inverter 8 is arranged. An input signal $V_{in}$ is supplied to the inverter 8, and an output signal N8 from the inverter 8 is supplied to the gate of the n-channel MOS transistor 6.

Figure 6:
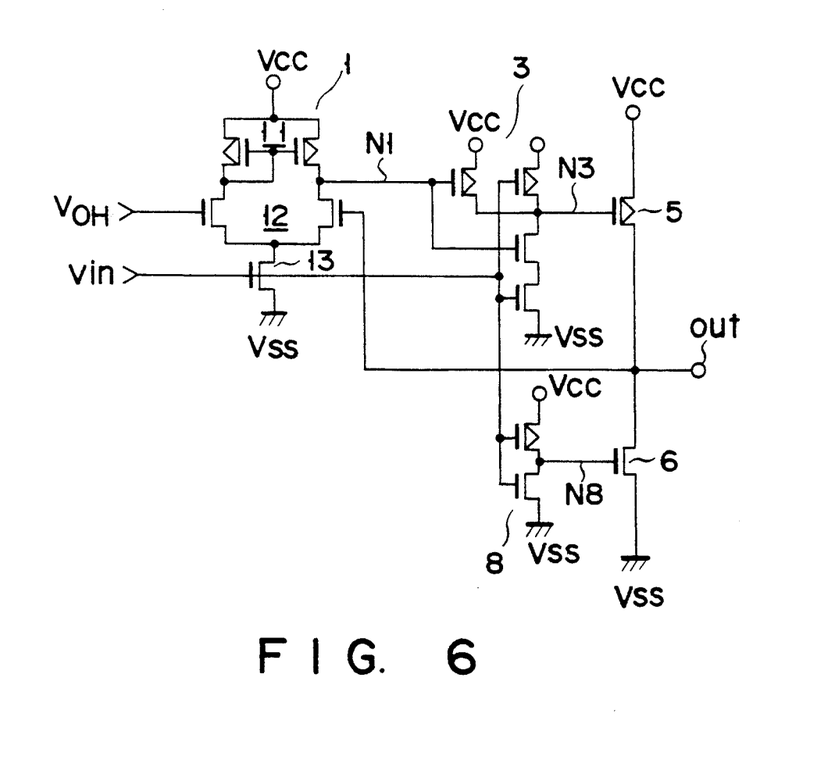
FIG. 6 is a circuit diagram showing a detailed arrangement of the output circuit in FIG. 5 according to the fourth embodiment.

FIG. 6 shows a detailed arrangement of the circuit of the embodiment in FIG. 5. The differential amplifier 1 consists of a CMOS current mirror load circuit 11 having two p-channel MOS transistors, a differential pair 12 having two n-channel MOS transistors, and an n-channel overcurrent protection MOS transistor 13, a gate of which receives an input signal $V_{in}$ and which is ON-/OFF-controlled in accordance with the signal $V_{in}$. The NAND gate 3 and the inverter 8 respectively have conventional CMOS circuit arrangements.

When an increase in current consumption need not be considered, a power source voltage $V_{cc}$ is supplied to the gate of the MOS transistor 13 in the differential amplifier 1 as in the same case as shown in FIG. 2, and the differential amplifier 1 can always be set in an operating state.

Figure 7:
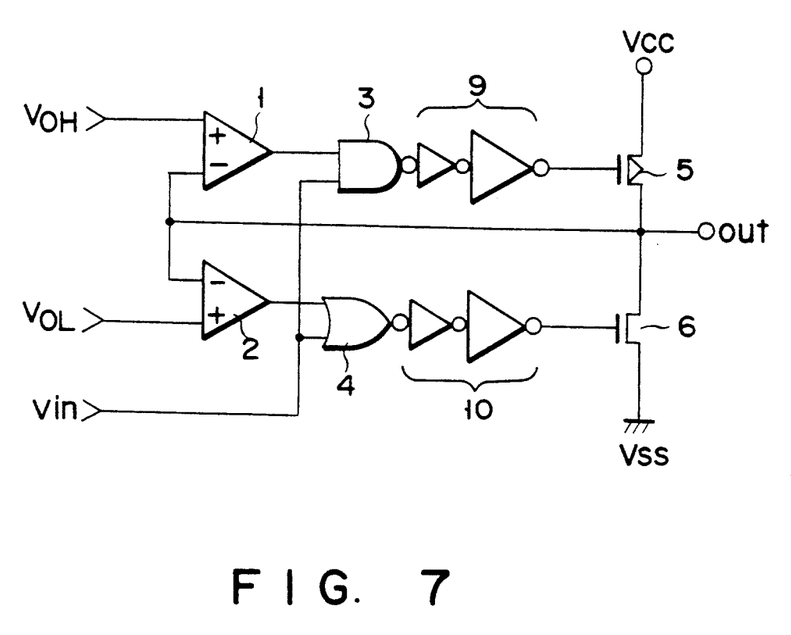
FIG. 7 is a circuit diagram showing a modification of the output circuit in FIG. 1 according to the first embodiment.

FIG. 7 shows a modification of the circuit according to the first embodiment. In the circuit of this modification, a buffer circuit 9 consisting of two inverters connected in series is inserted between a NAND gate 3 and the gate of a p-channel MOS transistor 5, and a buffer circuit 10 consisting of two inverters connected in series is inserted between a NOR gate 4 and the gate of an n-channel MOS transistor 6. Even when the channel widths of the MOS transistors 5 and 6 are very large, current consumption in the differential amplifiers 1 and 2 can be largely reduced by using an amplification effect of the buffer circuits 9 and 10. This modification can be applied to the circuits in FIGS. 4 and 5.

The present invention is not limited to the above embodiments, and various modifications can be made. For example, in the embodiments, a p-channel MOS transistor is used to raise an output voltage $V_{out}$ to a voltage $V_{OH}$ side. However, when the threshold voltage of an n-channel MOS transistor is set to be a voltage $V_{THN}$, the voltage $V_{out}$ can be raised to the $V_{OH}$ side by using the n-channel MOS transistor in place of the p-channel MOS transistor when the value $V_{THN}$ is set to satisfy a condition of $V_{OH} < V_{cc} < V_{THN}$. Similarly, an n-channel MOS transistor is used to drop an output voltage $V_{out}$ to a $V_{OL}$ side in the above embodiments. However, when the threshold voltage of the p-channel MOS transistor is set to be a voltage $V_{THP}$, the voltage $V_{out}$ can be dropped to the $V_{OL}$ side by using the p-channel transistor in place of the n-channel transistor when the voltage $V_{THP}$ is set to satisfy a condition of $V_{OL} > V_{cc} + |V_{THP}|$.

In the circuits described in FIGS. 2, 3, and 6, although the current mirror load circuit in the differential amplifier consists of two p-channel MOS transistors, the current mirror load circuit may consist of n-channel MOS transistors. However, when the condition of $V_{OL} < V_{THN}$ and the condition of $V_{OH} > V_{cc} - |V_{THP}|$ are satisfied, a current mirror load circuit consisting of p-channel MOS transistors cannot be used in the differential amplifier to which the voltage $V_{OH}$ is applied, and a current mirror load circuit consisting of n-channel MOS transistors cannot be used in the differential amplifier to which the voltage $V_{OL}$ is applied.

The reference voltages $V_{OH}$ and $V_{OL}$ used in circuits described in the above embodiments can be generated by various generators. As the most useful generator which can compensate a power source voltage dependency and temperature dependency, a band-gap reference voltage generator is used. Since both the reference voltages only used for driving the gates of MOS transistors, the generator has small current drivability. In addition, since only the generator continuously outputs a voltage at a DC level, the generator need not perform a high-speed switching operation. Therefore, even when a bipolar transistor which can be formed by a CMOS process is used, satisfactory characteristics can be obtained, and the CMOS process need not be specially changed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output circuit comprising:
   first and second power sources;
   an input terminal receiving an input voltage;
   an output terminal;
   a first MOS transistor having a control gate and first and second current terminals respectively coupled between said first power source and said output terminal;
   a second MOS transistor having a control gate and first and second current terminals respectively coupled between said second power source and said output terminal;
   a first differential amplifier for comparing a first reference voltage with a voltage at said output terminal;
   a second differential amplifier for comparing a second reference voltage lower than said first reference voltage with said voltage at said output terminal;
   a first logic gate for receiving an output from said first differential amplifier and said input voltage, said first logic gate having an output terminal connected to said gate of said first MOS transistor; and
   a second logic gate for receiving an output from said second differential amplifier and said input voltage, said first logic gate having an output terminal connected to said gate of said second MOS transistor.

2. The circuit according to claim 1, wherein said first reference voltage and said voltage at said output terminal are applied to a non-inverting input terminal of said first differential amplifier and to an inverting input terminal of said first differential amplifier;
   said second reference voltage and said voltage at said output terminal are applied to a non-inverting input terminal of said second differential amplifier and to an inverting input terminal of said second differential amplifier;
   said first logic gate is a two-input NAND gate;
   said second logic gate is a two-input NOR gate;
   said first MOS transistor is a p-channel MOS transistor; and
   said second MOS transistor is an n-channel MOS transistor.

3. The circuit according to claim 1, wherein said first differential amplifier consists of a first pair of MOS transistors having gates for receiving said first reference voltage and said voltage at said output terminal and a first current supplying circuit for equalizing values of currents flowing through current paths of said MOS transistors constituting said first pair of MOS transistors; and
   said second differential amplifier consists of a second pair of MOS transistors having gates for receiving said second reference voltage and said voltage at said output terminal and a second current supplying circuit for equalizing values of currents flowing through current paths of said MOS transistors constituting said second pair of MOS transistors.

4. The circuit according to claim 3, wherein said first current supplying circuit is a current mirror circuit consisting of a pair of MOS transistors of a conductivity type different from a conductivity type of said first pair of MOS transistors; and
   said second current supplying circuit is a current mirror circuit consisting of a pair of MOS transistors of a conductivity type different from a conductivity type of said second pair of MOS transistors.

5. The circuit according to claim 3, further comprising:
   a first through current protection MOS transistor coupled between one current terminal of said first pair of MOS transistors of the first differential amplifier and said second power source;
   a second through current protection MOS transistor coupled between one current terminal of said second pair of MOS transistors of said second differential amplifier and said second power source; and
   wherein said input voltage and an input obtained by inverting said input voltage are complimentarily input to gates of said first and second through current protection MOS transistors.

6. The circuit according to claim 1, further comprising:
   a first buffer circuit coupled between said first logic gate and said control gate of said first MOS transistor, and a second buffer circuit coupled between said second logic gate and said control gate of said second MOS transistor.

7. The circuit according to claim 6, wherein each of said first and second buffer circuits consists of two inverters connected in series with each other.

8. The output circuit according to claim 1, wherein said input voltage is a CMOS level signal and said output signal is a TTL level signal.

9. The output circuit according to claim 8, wherein said first reference voltage is a TTL high level signal and said second reference voltage is a TTL low level voltage signal.

10. The output circuit according to claim 1, wherein said input voltage is a CMOS level signal and said output signal is a ECL level signal.

11. The output circuit according to claim 10, wherein said first reference voltage is an ECL high level signal and said second reference voltage is an ECL low level voltage signal.

12. An output circuit, comprising:
first and second power sources;
an input terminal receiving an input voltage;
an output terminal;
a p-channel MOS transistor having a control gate and first and second current terminals respectively coupled between said first power source and said output terminal;
an n-channel MOS transistor having a control gate and first and second current terminals respectively coupled between said second power source and said output terminal;
a first differential amplifier having a noninverting input terminal and an inverting input terminal which receive a first reference voltage and a voltage at said output terminal, respectively;
a second differential amplifier having a noninverting input terminal and an inverting input terminal which receive a second reference voltage lower than said first reference voltage and the voltage at said output terminal, respectively;
a two-input NAND gate for receiving an output from said first differential amplifier and said input voltage, said two-input NAND gate having an output terminal connected to said control gate of said first MOS transistor; and
a two-input NOR gate for receiving an output from said second differential amplifier and said input voltage, said two-input NOR gate having an output terminal connected to said control gate of said second MOS transistor.

13. The circuit according to claim 12, wherein said first differential amplifier consists of a first pair of MOS transistors having gates for receiving said first reference voltage and said voltage at said output terminal and a first current supplying circuit for equalizing values of currents flowing through current paths of said MOS transistors constituting said first pair of MOS transistors; and
said second differential amplifier consists of a second pair of MOS transistors having gates for receiving said second reference voltage and said voltage at said output terminal and a second current supplying circuit for equalizing values of currents flowing through current paths of said MOS transistors constituting said second pair of MOS transistors.

14. The circuit according to claim 13, wherein
said first current supplying circuit is a current mirror circuit consisting of a pair of MOS transistors of a conductivity type different from a conductivity type of said first pair of MOS transistors; and said second current supplying circuit is a current mirror circuit consisting of a pair of MOS transistors of a conductivity type different from a conductivity type of said second pair of MOS transistors.

15. The circuit according to claim 13, further comprising:
a first through current protection MOS transistor coupled between one current terminal of said first pair of MOS transistors of the first differential amplifier and said second power source;
a second through current protection MOS transistor coupled between one current terminal of said second pair of MOS transistors of said second differential amplifier and said second power source; and
wherein said input voltage and an input obtained by inverting said input voltage are complimentarily input to gates of said first and second through current protection MOS transistors respectively.

16. An output circuit for receiving an input logic level signal of a first logic type and outputting an output logic signal of a second logic type, said output circuit, comprising:
an input terminal receiving said input logic level signal;
an output terminal outputting said output logic level signal;
a MOS transistor having a control gate and first and second current terminals respectively connected between said ground source and said output terminal;
a differential amplifier for comparing a reference voltage of the second logic type with a voltage at said output terminal; and
a logic gate having a first input terminal for receiving an output from said differential amplifier, a second input terminal for receiving said input logic level signal, and an output terminal coupled to said control gate of said MOS transistor.

17. The circuit according to claim 16, wherein said logic gate is a NAND gate.

18. The output circuit according to claim 16, wherein said input logic level signal is a CMOS logic level signal and said output logic level signal is an ECL logic level signal.

19. An output circuit, comprising:
first and second power sources;
an input terminal receiving an input voltage;
an output terminal;
a first MOS transistor having a control gate and first and second current terminals respectively coupled between said first power source and said output terminal;
a second MOS transistor having a control gate and first and second current terminals respectively coupled between said second power source and said output terminal;
a differential amplifier for comparing a reference voltage with a voltage at said output terminal;
a first logic gate for receiving an output from said differential amplifier and said input voltage, said first logic gate having an output terminal connected to said control gate of said first MOS transistor; and
a second logic gate for inverting said input voltage and having an output terminal connected to said control gate of said second MOS transistor.

20. The circuit according to claim 19, wherein said second logic gate is an inverter.

21. The circuit according to claim 20, wherein
said differential amplifier consists of a pair of MOS transistors for respectively receiving said reference voltage and the voltage at said output terminal, a current supplying circuit for equalizing currents flowing through current paths of said MOS transistors constituting said pair MOS transistors, and a through current protection MOS transistors having a gate receiving said input voltage and which is coupled between one current terminal of said path of MOS transistors and said second power source voltage.

22. An output circuit for receiving an output logic level signal of a first logic type and outputting an output logic level signal of a second logic type, said output circuit comprising:

first and second power sources;

an input terminal receiving said input logic level signal;

an output terminal for outputting said output logic level signal;

a first MOS transistor having a control gate and first and second current terminals respectively coupled between said first power source and said output terminal;

a second MOS transistor having a control gate and first and second current terminals respectively coupled between said second power source and said output terminal; check a first differential amplifier for comparing a first reference voltage with a voltage at said output terminal;

a second differential amplifier for comparing a second reference voltage lower than said first reference voltage with said voltage at said output terminal;

a first logic gate for receiving an output from said first differential amplifier and said input voltage, said first logic gate having an output terminal connected to said gate of said first MOS transistor; and a second logic gate for receiving an output from said second differential amplifier and said input voltage, said first logic gate having an output terminal connected to said gate of said second MOS transistor.

23. The output circuit according to claim 22, wherein said input signal is a CMOS level signal and said output signal is a TTL level signal.

24. The output circuit according to claim 22, wherein said first reference voltage is a TTL high level signal and said second reference voltage is a TTL low level voltage signal.

25. The output circuit according to claim 22, wherein said input signal is a CMOS level signal and said output signal is a ECL level signal.

26. The output circuit according to claim 25, wherein said first reference voltage is an ECL high level signal and said second reference voltage is an ECL low level voltage signal.

27. An output circuit, comprising:

an input terminal receiving an input voltage;

an output terminal;

a ground potential source;

a MOS transistor having a control gate and first and second current terminals respectively connected between said ground potential source and said output terminal;

a differential amplifier for comparing a reference voltage with a voltage at said output terminal; and a NAND gate having a first input terminal receiving an output of said differential amplifier, a second input terminal receiving the input voltage, and an output terminal coupled to said control gate of said MOS transistor.

* * * * *